United States Patent
Nozuyama

[11] Patent Number: 6,151,694
[45] Date of Patent: Nov. 21, 2000

[54] METHOD OF EVALUATING FAULT COVERAGE

[75] Inventor: Yasuyuki Nozuyama, Tokyo, Japan

[73] Assignee: Kabushiki Kaisha Toshiba, Kawasaki, Japan

[21] Appl. No.: 09/192,416

[22] Filed: Nov. 16, 1998

[30] Foreign Application Priority Data

Nov. 17, 1997 [JP] Japan ................................ 9-315176

[51] Int. Cl.[7] .................................................. G01R 31/28
[52] U.S. Cl. ........................ 714/724; 714/738; 714/741
[58] Field of Search ................................. 714/724, 741, 714/738

[56] References Cited

U.S. PATENT DOCUMENTS

| | | | |
|---|---|---|---|
| 4,769,817 | 9/1988 | Krohn et al. | 714/33 |
| 5,862,149 | 1/1999 | Carpenter et al. | 364/490 |
| 5,991,907 | 11/1999 | Stroud et al. | 714/725 |
| 6,061,818 | 5/2000 | Touba et al. | 714/739 |

*Primary Examiner*—Phung M. Chung
*Attorney, Agent, or Firm*—Finnegan, Henderson, Farabow, Garrett & Dunner, L.L.P.

[57] ABSTRACT

There is provided a method of evaluating fault coverage, which enables the complete implement action of the test of macro-blocks embedded in a LSI by performing fault simulation. According to the present invention, the fault simulation of a macro-block such as a CPU core is performed on the assumption that the fault simulation of 100% assumed faults or sufficient % assumed faults for practical purpose is performed on a reference chip with use of a standard test pattern. In the fault simulation process, the fault sampling is performed at first in the macro-block, and the fault simulation is performed by inputting the standard test pattern into the macro-block. Subsequently, the sampled faults are embedded in a newly developed chip having the same macro-block, and then the fault simulation for the newly developed chip is then performed again with use of a test pattern obtained by modifying the standard test pattern. A list of detected and undetected faults of the newly developed chip is compared with a list of detected and undetected faults of the reference chip detected by using the standard test pattern. When these lists are identical, it is assured that the test of the macro-block in the newly developed chip was properly performed by using the test pattern and that the satisfactory fault coverage was obtained.

20 Claims, 2 Drawing Sheets

METHOD OF EVALUATING FAULT COVERAGE

BACKGROUND OF THE INVENTION

This invention relates to a method of evaluating fault coverage, such as testing technology for logic circuits included in a logic LSI, a VLSI, and a large scale circuit formed on a board, in particular, fault simulation technology.

Conventionally, the fault coverage of a test pattern has been evaluated to check how many faults can be detected with use of the test pattern by performing fault simulation on the assumption that arbitrary faults occur in inner nodes of a logic circuit included in a LSI or a large scale circuit formed on a board.

Particularly, according to fault simulation using as an assumed fault a stuck-at fault in which an inner node of a logic LSI is fixed at "0" or "1", the fault can be calculated relatively easily. In addition, it has been known that the fault coverage attained by such fault simulation has strong correlation with a rate of failed devices present among passed devices after performing the device selection by inputting the test pattern into the device and comparing outputs from the device with expected values, and with a failure rate at which failures of the logic LSIs occur in the field after shipping.

Further, when the test pattern has a low fault coverage, the test pattern can be improved to attain excellent fault coverage by manually adding a test pattern which can detect considerable percentage of undetected faults, thereby the shipping quality of the LSIs can be improved.

However, according to the above-mentioned conventional fault simulation method, it takes very long CPU time (e.g. several months) to perform the fault simulation. Due to this problem, the fault simulation has not been always performed for all the developed LSIs except for the case very high quality assurance is essentially required.

In view of the current level and the development of the fault simulation technology and the CPU performance of a work station for executing the fault simulation, this tendency not always to perform the fault simulation seems to remain unchanged in future, if relying merely on developing the current technology.

As an easy solution of the above-mentioned problem, a fault sampling method is employed wherein several to several tens % of faults are sampled to be subjected to the fault simulation. On a suitable condition, the fault coverage evaluation using this fault sampling method can be performed with errors of a few % within a one-order shorter CPU time than that of the fault simulation performed for the 100% assumed fault.

The conventional fault simulator, however, has been intended merely to easily perform the fault simulation of the entire chip. Therefore, when the fault coverage in a new chip including a circuit block once subjected to the fault coverage evaluation is intended to be evaluated, the fault sampling and the fault simulation must be performed again for the new chip including the circuit block.

As mentioned above, the fault simulation resources cannot be effectively used according to the conventional fault sampling method, and the result attained by the former fault simulation cannot be used in the next simulation. This is one of the problems which prevents the spread of the fault sampling method.

In fact, even if the circuit blocks having the same constitution and respectively embedded in LSI nets having different constitutions are subjected to the fault coverage evaluation, there is no possibility of detecting the same fault even by using the same test pattern. There are also present a case where a part of the circuit is not tested due to the deficiency of the embedding technology even if a test pattern is input, and a case where a part of the test pattern is omitted due to some trouble. The cause of the undetection thus cannot be identified easily or surely, and the standardization of the test pattern, which intends to attain a desired level of product quality, has not been attained.

As described above, the conventional fault simulation (in particular, the fault simulation using the fault sampling method) cannot use the best of its advantage, i.e., the reduction of the CPU time required for the fault simulation. In other words, the conventional fault simulation has not satisfied the requirement of the user, which reflects a current trend of the LSI development process: to develop various types of functional blocks and further so many types of derivative LSIs basically by integrating some of these blocks.

As described above, according to the conventional fault simulation based on the sampling technology, the entire portion of the chips must be subjected to the fault sampling and the fault simulation, even if the new chip has a circuit block once subjected to the fault coverage evaluation.

Due to this problem, not only the advantage of the sampling (the reduction of the fault simulation time) cannot be used the best, but also the standardization of test patterns and the effective use of the fault simulation resources cannot be attained.

BRIEF SUMMARY OF THE INVENTION

The present invention intends to solve the above-mentioned problem and to provide a method of the fault simulation, by which the standardization of test patterns and the effective use of the fault simulation resources can be attained.

The method of the present invention is intended to be used for the fault coverage evaluation in a first circuit including a logic circuit and a second circuit including the logic circuit equivalent to or a slightly different from the logic circuit. The second circuit is a derivative of the first circuit, and thus the fault detection capability of test patterns used for the logic circuit in the second circuit has been known by the fault simulation for the first circuit in the developing process of the first circuit. In the fault simulation for the logic circuit included in the first circuit, faults have been assumed by the sampling in the circuit.

The fault simulation method according to the present invention has the following features. By inputting the test pattern for the first circuit into the second circuit such that the test pattern can be applied to the fault simulation for the second circuit, the ability of detecting the faults assumed to occur in the logic circuit included in the second circuit, which is equivalent to or slightly different from the circuit included in the first circuit can be evaluated. In addition, according to the present invention, the fault detection capabilities in the first and second circuits are compared with each other, and it thus can be checked that the test pattern has the same effectiveness regarding the fault detections in the first and second circuits.

In the above-mentioned manner, the standardization of the test pattern for the fault detections in a plurality of derivatives and the effective use of the fault simulation resources can be attained, according to the method of the present invention.

More specifically, the object of the present invention are attained by a method of evaluating fault coverage of a test pattern, comprising the steps of: preparing a fault list in which faults are assumed by sampling in a logic circuit constituting all or a part of a first circuit; using the fault list as a fault list used for testing the logic circuit included in a second circuit including the logic circuit; performing fault simulation for the first circuit by inputting a predetermined test pattern into the first circuit; preparing a first fault information list by adding to the fault list information on detected and undetected faults, which is obtained by the fault simulation for the first circuit; performing fault simulation for the second circuit by inputting the predetermined test pattern which is determined to be applicable to the logic circuit included in the second circuit; preparing a second fault information list by adding to the fault list information on detected and undetected faults which is obtained by the fault simulation for the second circuit; and comparing the first and second fault information lists.

It is preferable to, when the first and second fault information lists are compared with each other, determine whether or not all of detected faults in the first fault information list are included in detected faults in the second fault information list.

It is also preferable that the second circuit is the same as the first circuit, and a part of a function realized by the first circuit is deleted by fixing a part of external and internal input signals to "1" or "0", there is provided with a mark indicating that faults assumed to occur in a circuit portion relating to only the deleted function can be deleted, otherwise, ignored, and in a part of the first and second circuits, which relates to functions realized both by the first and second circuits, faults are assumed by sampling.

It is further preferable that a test pattern used for testing the first circuit is a part of the predetermined test pattern used for testing the first circuit.

The object of the present invention are also attained by a method of evaluating fault coverage of first and second test patterns used for testing first and second circuits, the first circuit including a first logic circuit, and the second circuit including a second logic circuit slightly different from the first logic circuit, and the fault coverages of the first and second test patterns used for testing the first and second circuits are coverages of faults which occur in the first and second logic circuits, the method comprising: a first step of preparing a first fault list in which faults are assumed by sampling in the first logic circuit, performing fault simulation for the first circuit by inputting the first test pattern into the first circuit, preparing a first fault information list by adding to the first fault list information on detected and undetected faults and potentially detected faults, which is obtained by the fault simulation for the first circuit, preparing a second fault list by extracting from the first fault list faults, which are assumed to occur in the first logic circuit and not assumed to occur in the second logic circuit, with use of a difference extraction program, preparing a third fault list marking that the faults corresponding to the second fault list can be deleted from the first fault list, otherwise, ignored, with use of a program for marking that the faults corresponding to the second fault list can be deleted from the first fault list, otherwise, ignored, performing a fault simulation for the second circuit including the second logic circuit by inputting the second test pattern into the second logic circuit in which the faults in the third fault list are assumed to occur, preparing a third fault information list relating to a common portion of the first and second logic circuits by adding to the third fault list information of detected faults and potentially detected faults, which is obtained by the fault simulation for the second circuit including the second logic circuit, preparing a second fault information list marking that the assumed faults included in the second fault list can be deleted from the first fault information list, otherwise, ignored in the first fault list, with use of a program for marking that the assumed faults included in the second fault list can be deleted from the first fault information list, otherwise, ignored in the first fault information list, and comparing the second and third fault information lists in order to evaluate whether or not the faults assumed to occur in the common portion of the first and second logic circuits are detected; and a second step of preparing a fourth fault list by extracting a circuit portion included in the second logic circuit and not included in the first logic circuit with use of the difference extraction program, and assuming that faults occur in the entire extracted circuit portion, performing a fault simulation for the second circuit including the second logic circuit by inputting the second test pattern into the second logic circuit in which the faults in the fourth fault list are assumed to occur, preparing a fourth fault information list relating to a portion not included in the first logic circuit and included in the second logic circuit by adding to the fourth fault list information of detected faults and potentially detected faults, which is obtained from the fault simulation for the second circuit, and comparing the fault coverage obtained from the fourth fault information list and a fault coverage standard to evaluate fault coverage of the second test pattern for the added portion not included in the first logic circuit and included in the second logic circuit.

It is preferable that a the second test pattern is constituted of the first test pattern and an additional test pattern added for testing the circuit portion included in the second logic circuit and not included in the first logic circuit.

It is also preferable that in the third and fourth fault information lists are prepared by assuming that the faults in the third fault list are assumed by same sampling in the common portion of the first and second logic circuits, the faults in the fourth fault list are assumed in the entire portion of the added portion in the second logic circuit to the first logic circuit, and the faults in the third and fourth lists are assumed to occur in the second logic circuit, performing the fault simulation for the second circuit including the second logic circuit by inputting the second test pattern in the second logic circuit, and adding to the third and fourth fault lists information faults are detected by the fault simulation.

It is further preferable that the faults in the fourth fault list are assumed by sampling to occur in the circuit portion included in the second logic circuit and not included in the first logic circuit.

It is still further preferable that the faults in the third fault list and the faults in the fourth fault list prepared by sampling are assumed to occur in the second circuit, a fault information list of the second logic circuit is prepared by inputting the second test pattern into the second logic circuit, and the fault information list of the second logic circuit is used to evaluate the fault coverage of the third test pattern used for testing the third logic circuit slightly different from the second logic circuit.

It is further preferable that the faults in logic circuits are assumed to occur in nodes obtained by expanding the logic circuit to a Boolean algebraic equation according to a predetermined rule, and representing the Boolean algebraic equation in a form of a diagram.

When the same logic function is synthesized with use of logic symbols such as combinational gates and latches or flip-flops, the logic symbols can be arbitrarily combined with each other, and thus the nodes at which faults are assumed to occur cannot be non-ambiguously determined in the logic diagram. On the other hand, according to the above-mentioned method of the present invention, the logic function is symbolized with use of the Boolean algebra equation, and thus the nodes can be nonambiguitically determined in the logic diagram. The applicability of the fault coverage evaluation of the present invention can be remarkably improved thereby.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described in detail with reference to the drawings.

Figure 1:
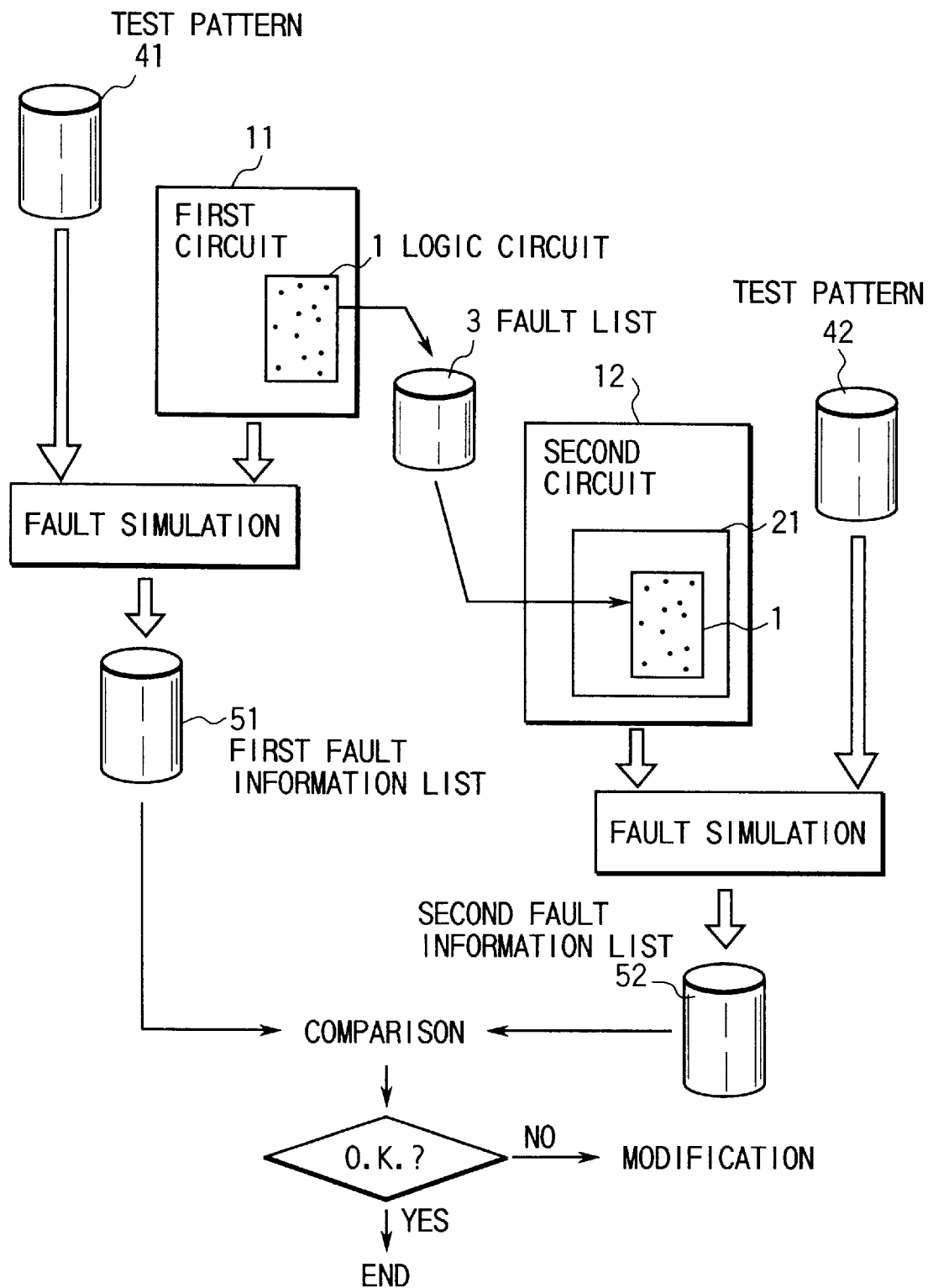
FIG. 1 is a flow diagram representing the flow of the fault coverage evaluation process according to the first embodiment of the present invention.

FIG. 1 is a flow diagram representing the flow of the fault coverage evaluation process according to the first embodiment of the present invention.

A first circuit 11 as a reference circuit includes a logic circuit 1. The first circuit 11 may be constituted of the logic circuit 1 alone. A second circuit 12 is a derivative of the first circuit and larger than the first circuit. The second circuit 12 also includes the logic circuit 1 embedded in a logic block 21, which provides a hierarchical structure to the second circuit. The second circuit 12 needs not always to be larger than the first circuit 11, and may be constituted of the logic circuit 1 alone.

A test pattern 41 is used to detect faults present in the logic circuit 1 in the first circuit 11. The test pattern 41 is input to the first circuit 11 into the logic circuit 1 to determine whether or not the faults assumed to occur in the first logic circuit 1 are detected by the fault simulation.

The first embodiment is intended to perform the fault simulation wherein the test pattern 41 is input to the first circuit 11 to test the logic circuit 1 included therein, the test pattern 41 is modified to the test pattern 42 so as to be input into the second circuit 12, thereby it is evaluated whether or not the faults assumed to occur in the logic circuit 1 included in the second circuit 12 can be detected by the test pattern 42 essentially in the same manner as the first circuit.

More specifically, faults are assumed to occur in the logic circuit 1 by performing the sampling as indicated by a plurality of points of FIG. 1. Then, the fault simulation is performed by inputting the test pattern 41 to the first circuit into the logic circuit, and the information on detection of assumed faults is obtained by the fault simulation. Next, the fault simulation for the second circuit is performed by inputting the test pattern 42 to the second circuit into the logic circuit 1. Then, the information on detection of assumed faults by inputting the test pattern 41 and that obtained by inputting the test pattern 42 are compared with each other to verify whether or not the test pattern 42 can detect the faults assumed in the logic circuit in the second circuit in the same manner (apart from time of detection) as the test pattern 41 can detect those assumed in the logic circuit in the first circuit. The faults assumed by the sampling to occur are schematically shown in the drawing in a form of the plurality of dots in the logic circuit.

According to the present embodiment, the test pattern used for the firstly developed circuit is used as a test pattern standard in the above manner, and thus the fault simulation resources (results) obtained by the former fault simulation can be effectively used for the fault simulation of a series of the derivatives including the first developed circuit. More detailed description of the specific steps of this method is presented below.

At first, faults are assumed to occur in the logic circuit 1 in the first circuit 11 by the sampling, and a fault list 3 for the logic circuit 1 is prepared. The fault list 3 is also used as a fault list of the logic circuit 1 in the second circuit 12.

The test pattern includes input/output terminal information, strobe information indicating the timing of the output observation, and the like. The fault simulation result obtained by inputting the test pattern 41 to the first circuit 11 into the logic circuit 1 is stored in a first list 51 having information on detection of assumed faults (hereinafter referred to as "the first fault information list"). The fault list 3 and the first fault information list 51 store the same assumed faults which are sampled in the logic circuit 1. The first fault information list 51 further stores additional information as the result of the fault simulation: whether or not the assumed faults are detected or potentially detected.

In the fault simulation, a definite output of a fault-free circuit may sometimes become an indefinite (unknown or floating) output due to the fault assumption. Such detection of faults is called potential detection: a fault which may be detected, and distinguished from the surely detected faults. The first fault information list 51 may also include such information.

The second circuit developed as a derivative of the first circuit is evaluated as will be described below. In this embodiment, the second circuit has a logic block 21 which is larger than the logic circuit 1 and includes the logic circuit 1 such that the logic circuit 1 is included in the second circuit hierarchically.

The faults registered in the fault list 3 are embedded in the logic circuit 1 of the second circuit. The test pattern 42 includes the test pattern used for the test of the logic circuit 1 included in the second circuit. In the case that there are many logic circuits like the logic circuit 1, the test pattern 42 includes test patterns for these logic circuits. However, the first and second circuits are different from each other in structure of the peripheral circuit, and thus the test pattern 41 cannot be directly used as the test pattern of the second circuit.

The test pattern 41 is modified in accordance with the difference of the peripheral circuit, to prepare the test pattern 42 capable of being used for the test of the logic circuit 1 in the second circuit. The modification of the test pattern 41 corresponds to the difference of the peripheral circuits of the first and second circuits, and thus the test pattern 42 can be prepared merely by modifying the test pattern 41 as a test pattern standard. In modification of the test pattern, additional test pattern may be added to the test pattern 41. If the logic circuit 1 is tested by a CPU contained in the device, the test pattern may be modified by modifying the higher assembler description or the like.

The main object of the present invention is to use the fault simulation resource (results) for the fault simulation during the development of a series of derivatives, by using the test pattern used for the test of the circuit developed at first. It is thus preferable that the test patterns 41 and 42 used for the first and second circuits 11 and 12 have the same pattern. In practical use, however, the test pattern 42 needs to be prepared by modifying the pattern standard in accordance with the difference in the peripheral circuits, as described above.

The fault simulation is performed by inputting the test pattern 42 to the second circuit into the logic circuit 1 after preparing the test patterns, thereby a second fault information list 52 storing information on detection of the faults in the logic circuit 1 included in the second circuit can be attained.

The second fault information list 52 is then compared with the already obtained first fault information list 51. If the detected faults and potentially detected faults present in the first and second fault information list 51 and 52 are identical to each other, or more detected faults or potentially detected faults than those of the first fault information list 51 are present in the second fault information list 52, it is determined that a predetermined level of a test as obtained for the logic circuit 1 in the first circuit 11 is performed for the logic circuit 1 included in the second circuit 12.

In the above-mentioned case, the first fault information list 51 is prepared by performing the fault simulation wherein the test pattern 41 is input to the first circuit 11 into the logic circuit 1 developed at first. The second fault information list 52 is then prepared by performing the fault simulation wherein the test pattern 42 is input to the second circuit 12 into the logic circuit 1 developed after the first circuit. When the first and second circuits are simultaneously developed, the first and second fault information lists 51 and 52 may be prepared also by performing the fault simulation for the first and second circuits simultaneously and adding the results of the fault simulations to the fault list 3.

As described above, when the test patterns 41 and 42 are somewhat different from each other and the fault covering capability of the test pattern 42 used for the test of the logic circuit 1 in the second circuit is lower than that of the fault covering capability of the test pattern 41 used for the test of the logic circuit 1 in the first circuit, there's little possibility that the informations on detection of assumed faults in the fault information lists 51 and 52 prepared by the sampling agree with each other.

If the fault sampling rate is set too low, however, the possibility of missing the omission or degradation of fault detection capability of a test will increase because the faults to be detected by the omitted test or degraded test by e.g. unintentional reduction of observable terminals may not be sampled at such a low sampling rate.

In order to prevent such a problem, the sampling rate must be set such a level that at least several faults are sampled for every 10–20 primitive cells in the logic circuit 1. By setting such sampling condition, the problem of the missing of the test due to the low sampling rate can be substantially completely prevented.

The present invention is the most useful for the derivatives of the conventional LSI, the most part of which is constituted of the logic circuit blocks developed before and several logic circuit blocks of which are newly developed for the derivative. When the first embodiment of the present invention is applied to such a case, the logic circuit 1, the fault list 3, the test pattern 41 as the test pattern standard, and the fault information list 51 are prepared for each of the derivative LSIs to perform the fault simulation in accordance with the first embodiment.

As described above, in the fault simulation for the newly developed logic circuit block, the fault simulation is performed on assumption that faults occur in nearly all the nodes in the circuit block, thereby the quality of the test pattern standard developed at first can be checked and improved toward the level satisfying the requirement. It is preferable in view of the quality assurance of the test patterns for the LSI that the fault simulation of the glue logic of the logic circuit block is performed on the assumption that faults occurs in all the nodes in the glue logic.

Figure 2:
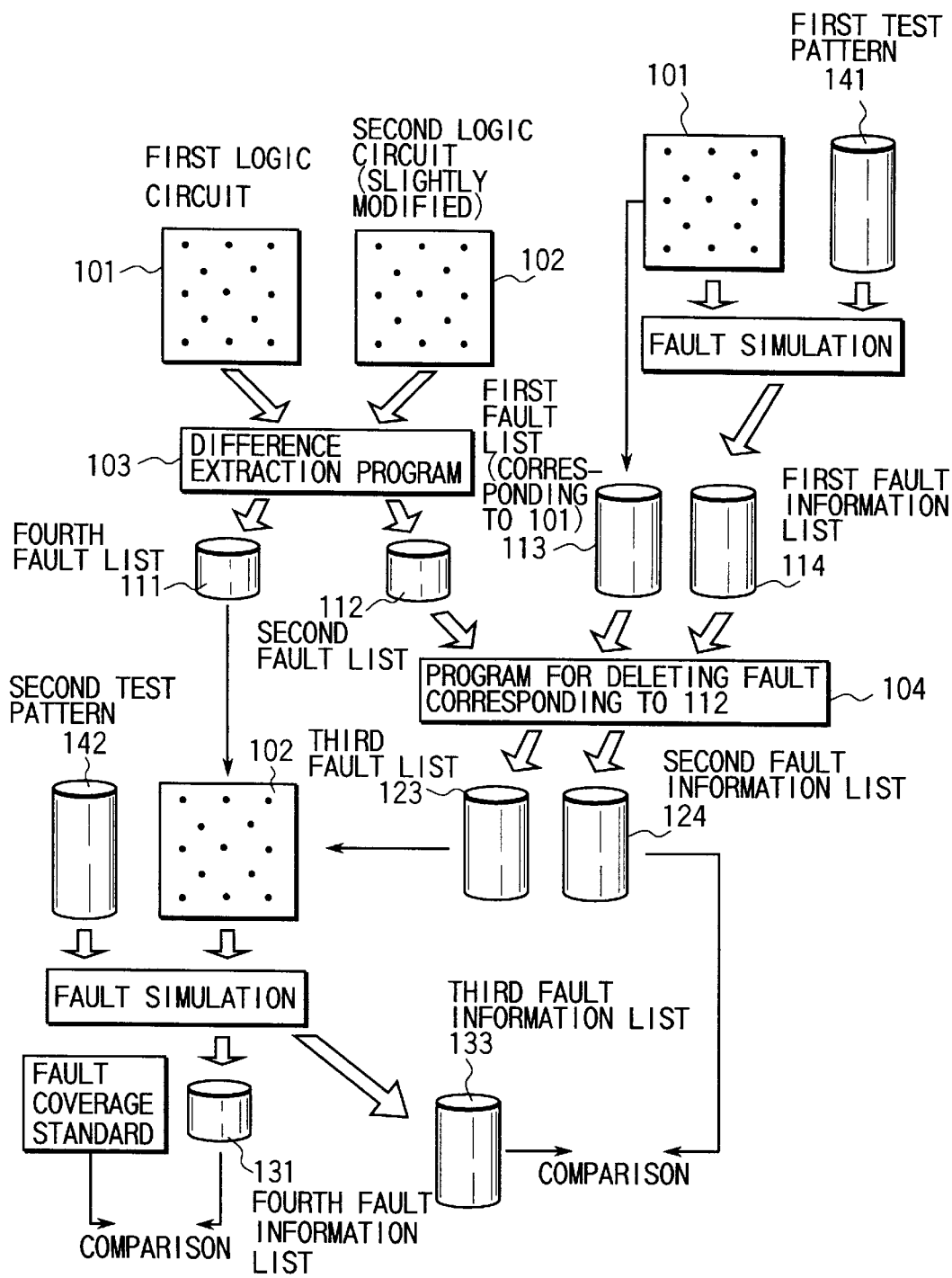
FIG. 2 is a flow diagram representing the flow of the fault coverage evaluation process according to the second embodiment of the present invention.

Next, the method of evaluating fault coverage according to the second embodiment of the present invention will be described below with reference to the flow diagram of FIG. 2. The flow diagram of FIG. 2 relates to the case where a first logic circuit 101 corresponding to the logic circuit 1 of the first embodiment is slightly modified into a second logic circuit 102.

Similarly to the first embodiment, the first and second logic circuits 101 and 102 may be included in the first and second circuits, respectively. The logic interconnection nets representing the first and second circuits 11 and 12 and the test patterns 41 and 42 used for the fault simulation shown in FIG. 1 are shown in FIG. 2 as the first and second logic circuits 101 and 102 and first and second test patterns 141 and 142, respectively.

The "slightly modified" second logic circuit in the embodiment means the second logic circuit modified by some manual operation or incremental logic synthesis. In this embodiment, the modified logic circuits can be found with respect to the not modified logic circuits as the most part of the second circuit.

The slight logic modification may include a modification as described below: when the second logic circuit 102 is the same as the first logic circuit 101 except that a part of the function realized by the first circuit is deleted by fixing a part of the external/internal input signals to "1" or "0", and there is provided a mark that the faults assumed to occur in the circuits related to only the deleted functions can be deleted or ignored. In the above mentioned case, the faults are assumed by the sampling in the circuits relating to the functions realized by both the first and second circuits.

The procedure of the fault coverage evaluation method according to the second embodiment will be described below in the order shown in the flow diagram of FIG. 2.

At first, faults are assumed to occur in the first logic circuit 101 by the sampling and a first fault list 113 is prepared. A test pattern 141 as a test pattern standard is then input into the first logic circuit (hereinafter "the first circuit" when the first logic circuit is included in the first circuit) to perform the fault simulation. After the fault simulation, a first fault information list 114 is prepared. The first fault information list 114 stores the information whether or not the assumed faults are detected by the fault simulation, in addition to the information stored in the first fault list 113.

Next, the logic interconnection of the first and second logic circuits is input into a difference extraction program 103 for extracting the modified circuit portions to prepare a second fault list 112. The second fault list 112 stores the nodes of the second logic circuit 102, which are deleted from the first logic circuit 101, and the faults assumed to occur in the deleted nodes.

The second fault list 112 is input together with the first fault list 113 prepared for the first logic circuit 101 into a program for marking that the faults corresponding to the second fault list 112 can be deleted from the first fault list 113 or ignored. With use of the program 104, it is marked that the nodes registered in the second fault list 112 can be deleted from the first fault list 113 or ignored, and a third fault list 123 is prepared.

The third fault list 123 is intended to store faults assumed by the sampling in the common part of the first and second logic circuits 101 and 102. By assuming that the faults registered in the third fault list 123 occur in the second logic circuit, and inputting a second test pattern 142 into the second logic circuit 102, the fault simulation is performed.

The second test pattern 142 is prepared by modifying the first test pattern 141 as a test pattern standard so as to be applied to the second logic circuit 102. The test pattern may be also modified by adding some test patterns.

Then, a third fault information list 133 is prepared by adding to the third fault list 123 the information of detected faults and potentially detected faults, which is attained by the fault simulation for the second logic circuit.

Thereafter, the program 104 for marking that the faults corresponding to the second fault list 112 can be deleted from the first fault list or ignored is used again to prepare a second fault information list 124. There is marked in the second fault information list that the assumed faults which are included in the second fault list 112, can be deleted from the first fault information list 114 or ignored.

If the second fault information list 124 coincides with the third fault information list 133, or if the second fault information list 124 includes more detected faults or potentially detected faults than these registered in the third fault information list 133, the second test pattern is regarded as suitably used for the fault detection in the common circuit portions of the first and second logic circuits. As described above, the evaluation of the fault covering capability of the second test pattern at the first step of the second embodiment is performed in the similar manner to that of the first embodiment.

Next, a fourth fault list 111 is prepared with use of the difference extraction program 103 on the assumption that faults occur in all or most of the nodes which are not provided to the first logic circuit 101 but newly added to the second logic circuit 102. The faults registered in the fourth fault list 111 are assumed to occur in the second logic circuit, and the second test pattern 142 is input into the second logic circuit to perform the fault simulation. A fourth fault information list 131 is then prepared by adding the fault detection/undetection information obtained by the above-mentioned fault simulation to the fourth fault list 111.

By comparing the fault coverage obtained by the fourth fault information list 131 with a fault coverage standard, the fault coverage of the second test pattern in the added circuit portions in the second logic circuit is evaluated, thereby the second test pattern is developed to be suitably used for the fault detection of the added circuit portions in the second logic circuit.

The above-mentioned process is performed in the second step of the present embodiment, as the evaluation and development of the fault covering capability of the second test pattern. With use of the evaluation of the fault covering capability, which are obtained in the first and second steps, it can be judged whether or not the second test pattern can be suitably used for the fault detection in the second logic circuit.

As described above, the third fault list 123 can be obtained by inputting the first and second fault lists 113 and 112 into the program 104, and the second fault information list 124 can be obtained by inputting the first fault information list 114 and the second fault list 112 into the program 104. Accordingly, if there is provided the third fault list 123 from the first and second fault lists 113 and 112, the second fault information list 124 can be obtained from the first fault information list 114 without using the program 104 again.

Similarly, the second fault list 112 is obtained by inputting the first and second logic circuits into the difference extraction program 103 in the first step of the present embodiment, and the fourth fault list 111 is obtained by inputting the first and second logic circuits into the difference extraction program 103 in the second step. It is thus easy to simultaneously output the second and fourth fault lists 112 and 111 by inputting the first and second logic circuits into the difference extraction program 103.

Further, the third fault information list 133 is obtained in the first step of the present embodiment by performing the fault simulation wherein the faults registered in the third fault list 123 is assumed to occur in the second logic circuit and the second test pattern 142 is input into the second logic circuit. The fourth fault list 131 is obtained in the second step of the present embodiment by performing the fault simulation wherein the faults registered in the fourth fault list 111 are assumed to occur in the second logic circuit and the second test pattern 142 is input into the second logic circuit. Accordingly, the third and fourth fault information lists 133 and 131 can be obtained by performing once the fault simulation wherein the third and fourth fault lists 123 and 111 are assumed to occur in the second logic circuit 102 simultaneously, and the second test pattern 142 is then input into the second logic circuit 102.

As described above, by combining the simultaneous processes, more effective process flow can be attained in comparing with that described in the second embodiment.

The present invention is not limited to the above-mentioned embodiments. For example, the fault information list of the second logic circuit 102 can be prepared in the following manner: combining the faults registered in the fourth fault list 111 and those registered in the third fault list 123 and assuming these to occur in the second logic circuit 102, and the second test pattern 142 is then input into the second logic circuit 102. This fault information list can be used as a fault information list standard for evaluating the fault covering capability of the third test pattern which is derived from the second test pattern by modifying the second test pattern, so as to test the third logic circuit slightly different from the second logic circuit 102.

In order to more reduce the fault simulation performing time, the first fault information list 51 can be prepared by using a part of a predetermined test pattern 41 for testing the logic circuit 1 in the first embodiment, for example. The first fault information list 51 prepared in this manner can be used as a reference data for the evaluation of the fault coverage of the logic circuit 1 in the derivatives.

More specifically, when the test pattern 41 is constituted of a plurality of sub test-patterns, the fault simulation is performed to prepare the fault information list 51 by using a portion of each of the sub test patterns, which has a predetermined length from the beginning of the sub test-pattern. By preparing the fault information list 51 in this manner, not only the fault simulation performing time can be remarkably reduced, but also it can be easily checked that the test pattern 41 includes the sub test-patterns necessary for detecting the faults assumed to occur in the logic circuit 1.

In particular, by adjusting the length of each of the sub test-pattern portions used for the fault simulation such that an arbitrary number (several tens to 100, for example) of faults are detected everytime when a sub test-patterns is serially input into the logic circuit 1, the sub test-patterns can be checked to be included in the test pattern 41 more reliably.

In the case where the logic circuit 1 includes a circuit relating to the function not used by the user or not announced to any user, the faults in the circuit portions relating to only such a function does not cause any deficiency in practical operation. Therefore, it takes important meaning to distinguish the faults assumed to occur in such circuit portions from the other faults. Such a fault may be deleted from the third fault list 3 in the first embodiment, or given a mark indicating that the fault occurs in such a circuit portion.

In practical use, the marked fault may be subjected to the $I_{DDq}$ ($I_{DD}$ quiescent) test, for example. By treating the fault in this manner, the reliability of the test can be improved. The $I_{DDq}$ test is intended to detect whether or not any abnormal leakage current flows through in the CMOS by checking a power supply current $I_{DD}$ or the like. With use of the $I_{DDq}$ test, the deficiency which cannot be detected by the function test can be extracted, thereby the reliability of the test can be improved.

In this manner, according to the present invention, the test pattern having sufficient fault covering capability of detecting faults in newly developed products is developed as a test pattern standard and modified to perform the fault detection of the derivatives, and the fault covering capability can be evaluated for each of the modified test patterns.

In the above-mentioned embodiments, the fault simulation based on the stuck-at fault model has been performed as an example. It is easy and not deviated from the scope of the invention to apply the technical idea of the present invention to the fault simulation based on the other fault model.

The above-mentioned embodiments are generally applied to the case where some modification is required at the stage of the logic design at which the circuit function is represented as the connection of logic symbols. For the circuit design, the HDL (Hardware Description Language) is beginning to be used, and will be the mainstream of the circuit design in future.

In the present time, when the same circuit function is represented as the connection of logic symbols, apparently different symbols may be connected in the logic synthesis process, in most case. In future, the technical idea of so-called "Soft-Macro" will be spread in the circuit design. With use of the Soft-Macro, the combination logic is non-ambiguously expanded by using Boolean algebraic equation and the resultant solution is figured out as performed in the formal verification to assure the equivalence of the combination logic to the soft-macro. The fault simulation needs to be assume the faults at the level. Similarly, the HDL description of the same circuit is unchanged in one derivative and the other derivative, so that it is possible to assume faults on wires of a circuit described in HDL.

By performing the fault simulation in this manner, the present invention can be performed with no problem even if the connection of the logic symbols is apparently changed during the process of the logic synthesis. The other changes and modifications may be made in the invention without departing from the spirit and scope thereof.

As described above, according to the method of evaluating fault coverage of the present invention, a test pattern standard is prepared to perform fault simulations of LSIs having the same logic circuit block or slightly different logic circuits, or of the derivatives of a large-scaled circuit formed on a board. The results of the fault simulations can be used in the following fault simulations. In this manner, the fault simulation resources can be used effectively.

With use of the present invention, it can be checked with the minimum labor whether or not the logic circuit blocks included in the product are surely subjected to the test, and the manufacturing quality of the chip can be effectively assured. The present invention is useful particularly in the development of the derivatives, in which the same macro-block is repeatedly used; or in the case which may be occur in future, wherein the large-scaled macro block is put into a market as an IP (Intellectual Property) cell and an system is entirely mounted on a chip, and the standardization of the test is required as an essential condition.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of evaluating fault coverage of a test pattern, comprising the steps of:
    preparing a fault list in which faults are assumed by sampling in a logic circuit constituting all or a part of a first circuit;
    using the fault list as a fault list used for the logic circuit included in a second circuit including the logic circuit;
    performing fault simulation for the first circuit by inputting a predetermined test pattern into the first circuit;
    preparing a first fault information list by adding to the fault list information on detection of the assumed faults, which is obtained by the fault simulation for the first circuit;
    performing fault simulation for the second circuit by inputting the predetermined test pattern which is modified to be applicable to the logic circuit included in the second circuit;
    preparing a second fault information list by adding to the fault list information on detection of the assumed faults which is obtained by the fault simulation for the second circuit; and
    comparing the first and second fault information lists.

2. The method according to claim 1, wherein the logic circuit included in the second circuit is constituted of a circuit slightly different from the logic circuit included in the first circuit, the fault simulation for the second circuit is performed on assumption that faults occur in each of nodes which constitute a part of the slightly different circuit, and is added to the logic circuit in the second circuit, and there is provided a mark indicating that faults assumed to occur in a part of the slightly different circuit, which is deleted from the first circuit, can be deleted, otherwise ignored.

3. The method according to claim 2, wherein faults are assumed by sampling in a part of the logic circuit which is included both in the first and second circuits.

4. The method according to claim 1, wherein faults are assumed by sampling in a part of the logic circuit which is included both in the first and second circuits.

5. The method according to claim 1, wherein the second circuit is the same as the first circuit, and a part of a function realized by the first circuit is deleted by fixing a part of external and internal input signals to "1" or "0", there is provided with a mark indicating that faults assumed to occur in a circuit portion relating to only the deleted function can be deleted, otherwise, ignored, and in a part of the first and second circuits, which relates to functions realized both by the first and second circuits, faults are assumed by sampling.

6. The method according to claim 1, wherein a test pattern used for testing the first circuit is a part of the predetermined test pattern used for testing the first circuit.

7. The method according to claim 1, wherein the faults in the logic circuit is faults assumed to occur in nodes obtained by expanding the logic circuit to a Boolean algebraic equation according to a predetermined rule, and representing the Boolean algebraic equation in a form of a diagram.

8. The method according to claim 1, wherein the faults in the logic circuit is faults assumed to occur in nodes or wires of the logic circuit described in HDL.

9. A method of evaluating fault coverage of a test pattern, which is applicable to first and second circuits, the first and second circuits respectively including a common logic circuit, and fault coverage of the test pattern being coverage of faults present in the common logic circuit, the method comprising the steps of:

preparing a fault list in which faults are assumed by sampling in a logic circuit;

performing fault simulation for the first circuit by inputting a predetermined test pattern used for testing the common logic circuit into the first circuit;

performing fault simulation for the second circuit by inputting the predetermined test pattern which is modified to be applicable to the logic circuit included in the second circuit;

preparing first and second fault information lists by adding to the fault list informations on detection of the assumed faults, which are obtained by the fault simulations for the first and second circuits, respectively; and comparing the first and second fault information lists to evaluate whether or not the faults assumed to occur in the common logic circuits included in the first and second circuits respectively are detected with use of the predetermined test pattern.

10. The method according to claim 9, wherein the first circuit is constituted only of the logic circuit.

11. The method according to claim 9, wherein means for comparing the first and second fault information lists determine whether or not all of detected faults and potentially detected faults in the first fault information list are included in detected faults, and detected faults or potentially detected faults in the second fault information list, respectively.

12. The method according to claim 9, wherein the faults in the common logic circuit is faults assumed to occur in nodes obtained by expanding the logic circuit to a Boolean algebraic equation according to a predetermined rule, and representing the Boolean algebraic equation in a form of diagram.

13. The method according to claim 9, wherein the faults in the common logic circuit described in HDL.

14. A method of evaluating fault coverage of first and second test patterns used for testing first and second circuits, the first circuit including a first logic circuit, and the second circuit including a second logic circuit slightly different from the first logic circuit, and the fault coverages of the first and second test patterns used for testing the first and second circuits are coverages of faults which occur in the first and second logic circuits, the method comprising:

a first step of preparing a first fault list in which faults are assumed by sampling in the first logic circuit, performing fault simulation for the first circuit by inputting the first test pattern into the first circuit, preparing a first fault information list by adding to the first fault list information on detection of the assumed faults, which is obtained by the fault simulation for the first circuit, preparing a second fault list by extracting from the first fault list faults, which are assumed to occur in the first logic circuit and not assumed to occur in the second logic circuit, with use of a difference extraction program, preparing a third fault list marking that the faults corresponding to the second fault list can be deleted from the first fault list, otherwise, ignored, with use of a program for marking the faults corresponding to the second fault list can be deleted from the first fault list, otherwise, ignored, performing a fault simulation for the second logic circuit by inputting the second test pattern into the second logic circuit in which the faults in the third fault list are assumed to occur, preparing a third fault information list relating to a common portion of the first and second logic circuits by adding to the third fault list information on detection of the assumed faults, which is obtained by the fault simulation for the second logic circuit, preparing a second fault information list marking that the faults included in the second fault list can be deleted from the first fault list, otherwise, ignored in the first fault list, with use of a program for marking the faults included in the second fault list can be deleted from the first fault list, otherwise, ignored the first fault list, and comparing the second and third fault information lists in order to evaluate whether or not the faults assumed to occur in the common portion of the first and second logic circuits are detected; and a second step of preparing a fourth fault list by extracting a circuit portion included in the second logic circuit and not included in the first logic circuit with use of the difference extraction program, and assuming that faults occur in the entire extracted circuit portion, performing a fault simulation for the second logic circuit by inputting the second test pattern into the second logic circuit in which the faults in the fourth fault list are assumed to occur, preparing a fourth fault information list relating to a portion not included in the first logic circuit and added to the second logic circuit by adding to the fourth fault list information on detection of the assumed faults, which is obtained from the fault simulation for the second circuit, and comparing the fault coverage obtained from the fourth fault information list and a fault coverage standard to evaluate fault coverage of the second test pattern for the added portion not included in the first logic circuit and added to the second logic circuit.

15. The method according to claim 14, wherein the second test pattern is constituted of the first test pattern and an additional test pattern added for testing the circuit portion included in the second logic circuit and not included in the first logic circuit.

16. The method according to claim 14, wherein in the third and fourth fault information lists are prepared by assuming that the faults in the third fault list are assumed by sampling to occur in the common portion of the first and second logic circuits, the faults in the fourth fault list are assumed in the entire portion of the added portion in the second logic circuit, and the faults in the third and fourth lists are assumed to occur in the second logic circuit, performing the fault simulation for the second logic circuit by inputting the second test pattern in the second logic circuit, and adding to the third and fourth fault lists information whether or not the faults are detected by the fault simulation.

17. The method according to claim 14, wherein the faults in the fourth fault list are assumed by sampling in the circuit portion included in the second logic circuit and not included in the first logic circuit.

18. The method according to claim 14, wherein the faults in the third fault list and the faults in the fourth fault list prepared by sampling are assumed to occur in the second circuit, a fault information list of the second logic circuit is prepared by inputting the second test pattern into the second logic circuit, and the fault information list of the second logic circuit is used to evaluate the fault coverage of the third test pattern used for testing the third logic circuit slightly different from the second logic circuit.

19. The method according to claim 14, wherein the faults assumed to occur in the logic circuit are faults assumed to occur in nodes obtained by expanding the logic circuit to a Boolean algebraic equation according to a predetermined rule, and representing the Boolean algebraic equation in a form of a diagram.

20. The method according to claim 14, wherein the faults assumed to occur in the logic circuit are faults assumed to occur in nodes or wires of logic circuit described in HDL.

* * * * *

UNITED STATES PATENT AND TRADEMARK OFFICE
CERTIFICATE OF CORRECTION

PATENT NO.   : 6,151,694
DATED        : November 21, 2000
INVENTOR(S)  : Yasuyuki Nozuyama It is certified that error appears in the above-identified patent and that said Letters Patent is hereby corrected as shown below:

Column 13, claim 7,
Line 17, "is faults" should read -- are faults --.

Column 13, claim 8,
Line 22, "is faults" should read -- are faults --.

Column 13, claim 12,
Line 59, "is faults" should read -- are faults --.

Column 15, claim 16,
Line 6, after "wherein", delete "in".

Signed and Sealed this

Sixteenth Day of April, 2002

Attest:

Attesting Officer

JAMES E. ROGAN
*Director of the United States Patent and Trademark Office*